(12) United States Patent
Zarnowitz et al.

(10) Patent No.: US 7,023,704 B1
(45) Date of Patent: Apr. 4, 2006

(54) EJECTOR LATCH

(75) Inventors: Arthur Harvey Zarnowitz, San Jose, CA (US); Craig Yamada, San Jose, CA (US)

(73) Assignee: CIENA Corporation, Linthicum, MD (US)

( * ) Notice: Subject to any disclaimer, the term of this patent is extended or adjusted under 35 U.S.C. 154(b) by 16 days.

(21) Appl. No.: 10/753,438

(22) Filed: Jan. 9, 2004

(51) Int. Cl.
*H05K 7/12* (2006.01)

(52) U.S. Cl. ...................... 361/754; 361/798

(58) Field of Classification Search ............... 361/754, 361/801, 798; 312/222, 223
See application file for complete search history.

(56) References Cited

U.S. PATENT DOCUMENTS 5,414,594 A * 5/1995 Hristake .................. 361/755
6,094,353 A * 7/2000 Koerber et al. ............. 361/754
6,443,315 B1 * 9/2002 Tabuchi .................... 211/41.17
6,512,679 B1 * 1/2003 Shearman et al. .......... 361/759
6,587,350 B1 * 7/2003 Lin et al. ................... 361/754
6,646,883 B1 * 11/2003 Salinas ....................... 361/727

* cited by examiner

*Primary Examiner*—Kamand Cuneo
*Assistant Examiner*—Dameon E. Levi
(74) *Attorney, Agent, or Firm*—Dougherty Clements; Christopher L. Bernard; Tyler S. Brown

(57) ABSTRACT

An embodiment of the invention provides an ejector latch that advantageously maximizes the use of face plate space in a circuit pack. An embodiment of the invention also provides an ejector latch, where sufficient force or leverage can now be provided by the user by grabbing a movable handle portion of the ejector latch in order to disengage the ejector latch from a portion or component of a carrier. Therefore, the movable handle portion of the ejector latch advantageously permits the application of more force to the ejector latch, in order to permit easier disengagement of the latch from the carrier.

14 Claims, 11 Drawing Sheets

*FIG. 4A*

CONVENTIONAL ART

*FIG. 4B*

CONVENTIONAL ART

EJECTOR LATCH

TECHNICAL FIELD

Embodiments of the invention relate generally to ejector latches for use with a circuit pack.

BACKGROUND

In circuit packs, it is typically important to maximize the use of face plate space. The face plate space can be used to support, for example, connectors, ESD (electrostatic discharge) prevention devices, indicating devices such as light emitting diodes (LEDs), and/or other important components. Many currently used connectors for circuit packs are high density connectors that require a high degree of force in order to connect the circuit pack to a carrier and to disconnect the connector (and circuit pack) from the carrier. Because of this required high degree of force, conventional latches are unable to adequately function as the connectors for circuit packs.

Therefore, the current approaches and/or technologies are limited to particular capabilities and/or suffer from various constraints and deficiencies.

SUMMARY OF EMBODIMENTS OF THE INVENTION

An embodiment of the invention provides an ejector latch that advantageously maximizes the use of face plate space in a circuit pack. An embodiment of the invention also provides an ejector latch, where sufficient force or leverage can now be provided by the user by grabbing a movable handle portion of the ejector latch in order to disengage the ejector latch from a portion of a carrier. Therefore, the movable handle portion of the ejector latch advantageously permits the user to apply more force to the ejector latch, in order to permit easier disengagement of the ejector latch from the carrier.

In one embodiment of the invention, an ejector latch includes: a latch base; a latch handle portion operatively coupled to the latch base; and a movable handle portion movingly coupled to the latch handle portion. Typically, the latch base is attachable to a face plate of a circuit pack. The movable handle portion may be configured to close against the latch handle portion. The movable handle portion may also be configured to extend away from the latch handle portion in order to pivot the latch handle portion with respect to the latch base and permit disengagement of the ejector latch from a carrier.

In yet another embodiment, the movable handle portion is movingly coupled to the latch handle portion by rotation the movable handle portion. The rotation of the movable handle portion permits the latch handle portion to pivot with respect to the latch handle base, in order to disengage the ejector latch from a carrier.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments of the invention.

Figures 1, 2, 3:
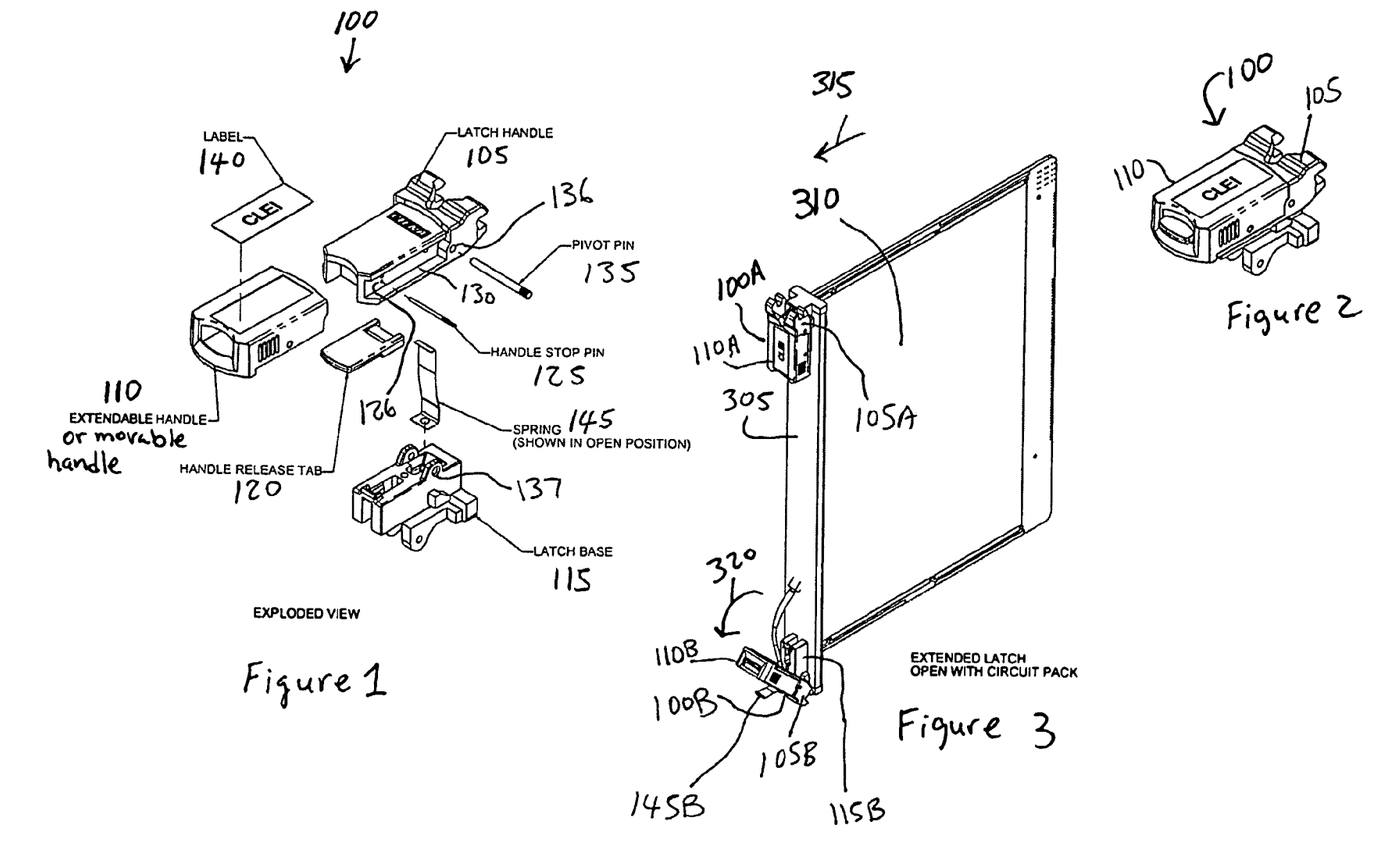
FIG. 1 is a block diagram illustrating the components of an ejector latch, in accordance with an embodiment of the invention.
FIG. 2 is a block diagram illustrating an embodiment of the ejector latch in a closed (and locked) position.
FIG. 3 is a block diagram illustrating an embodiment of the ejector latch as attached with a circuit pack.

FIG. 1 is a block diagram illustrating the components of an ejector latch 100, in accordance with an embodiment of the invention. An embodiment of the ejector latch 100 includes the following components. A latch handle portion 105 forms the basic handle portion of the ejector latch 100, while a movable handle portion 110 forms the movable (or extendable) portion that is attached to the latch handle portion 105. A latch base 115 attaches to a face plate of a circuit pack (e.g., face plate 305 of a circuit pack 310 in FIG. 3). A handle release tab 120 allows the movable handle portion 110 to disengage and extend away from the latch handle portion 105, in order to allow the circuit pack 310 to disengage from a carrier (e.g., 805 in FIG. 8), as discussed below. When the movable handle portion 110 is engaged against the latch handle portion 105, the ejector latch 100 is in the locked position, and as a result, the circuit pack 310 can be secured to the carrier, as discussed below.

A handle stop pin 125 inserted into handle stop hole 126 prevents the movable handle portion 110 from completely disengaging from the latch handle portion 105. The movable handle portion 110 can slide on a track 130 of the latch handle portion 105. A pivot pin 135 allows the ejector latch 100 to pivot or rotate out of the way from the components or edges of, for example, a carrier 805 (see FIG. 8) so that the circuit pack 310 can be pulled out of the carrier 805. For example, the circuit pack 310 can be pulled in the direction 315 after the ejector latch 100 is rotated out of the way of the components or edges of the carrier 805. This operation is described in additional detail below with reference to FIG. 8.

An optional label 140 may identify, for example, the name of a circuit pack 310 that is affixed to the ejector latch 100. Of course, the label 140 is an optional component.

A spring 145 permits the latch handle portion 105 to separate from the movable handle portion 110. The spring 145 pushes up against the handle release tab 120. This permits the movable handle portion 110 to be locked in place against the latch handle portion 105 when the movable handle portion 110 is closed (pushed) against the latch handle portion 105. When the handle release tab 120 is pressed by the user, the movable handle portion 110 can disengage away from the latch handle portion 105, and as a result, the ejector latch 100 can be rotated out a few degrees by the spring 145 to allow the circuit pack to be disengaged from, for example, a carrier 805.

It is noted that the particular shapes of the latch handle portion 105, the movable handle portion 110, and the latch base 115, as shown in the drawings, are provided as particular examples. The latch handle portion 105, the movable handle portion 110, and the latch base 115 may be shaped and/or configured in other manners without departing from the scope of embodiments of the invention.

In an embodiment of the invention, a method for assembling the ejector latch 100 can be performed based upon the following steps. A latch handle portion 105 is provided. A movable handle portion 110 is attached to the latch handle portion 105. The movable handle portion 110 is movingly coupled to the latch handle portion 105. The latch handle portion 105 is attached to a latch base 115.

The following steps can then be optionally performed. The latch base 115 may be attached to a face plate 305. Typically, the face plate 305 is attached to a circuit pack 310.

FIG. 2 is a block diagram illustrating the ejector latch 100 in a closed (and locked) position. In this closed position, the movable handle portion 110 is pressed against the latch handle portion 105 and is locked in place against the latch handle portion 105.

FIG. 3 is a block diagram illustrating the ejector latches 100A and 100B attached to the face plate 305 of the circuit pack 310. The ejector latch 100A is shown in a closed and locked position, where the movable handle portion 110A is locked in place against the latch handle portion 105A.

On the other hand, the ejector latch 100B is shown in an extended and unlocked position, where the movable handle portion 110B is unlocked and extended away from the latch handle portion 105B (i.e., the movable handle portion 110B is extended away from the latch handle portion 105B). As a result, the ejector latch 100B can be rotated in the direction 320 away from the face plate 305. Note that the latch base 115B is attached to the faceplate 305 and the spring 145B is shown in the open position.

Various types of circuit packs 310 from various manufacturers (e.g., CIENA CORPORATION) may be used with the ejector latches 100 but the invention is not limited thereto. Indeed a wide variety of circuit packs would benefit from the inventive latch designs disclosed here including but not limited to circuit packs containing optical, electrical, and/or opto-electrical components. Examples of suitable circuit packs 310 that may be used with the ejector latches 100 include, but are not limited to, the circuit packs from CIENA CORPORATION having the following product numbers: PXADMS01: PHANTOM, BOM, SYNC CARD FOR OC48ADM; DXMUX192 ASSY, 10G SONET/SDH, MUX, MODULE; and DXMUXDE2ASSY, GIGABIT MUX 1310 NM, as well as other suitable circuit packs from other manufacturers or vendors.

Figure 8:
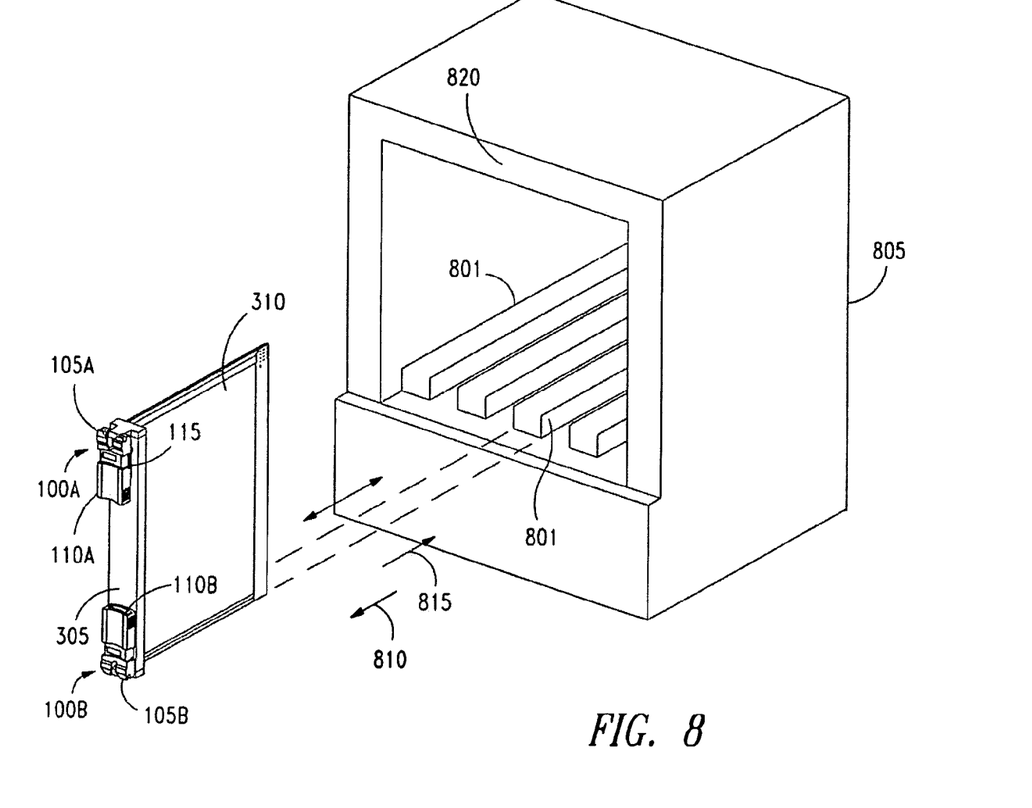
FIG. 8 is a block diagram illustrating an embodiment of an ejector latch that is attached to a faceplate of a circuit pack, where the circuit pack is insertable into a carrier.

The circuit pack 310 can typically be inserted into and can be remove from a carrier, such as, for example, the carrier 805 in FIG. 8. The carrier may, for example, include equipment that is used for a communication network.

Figure 4A:
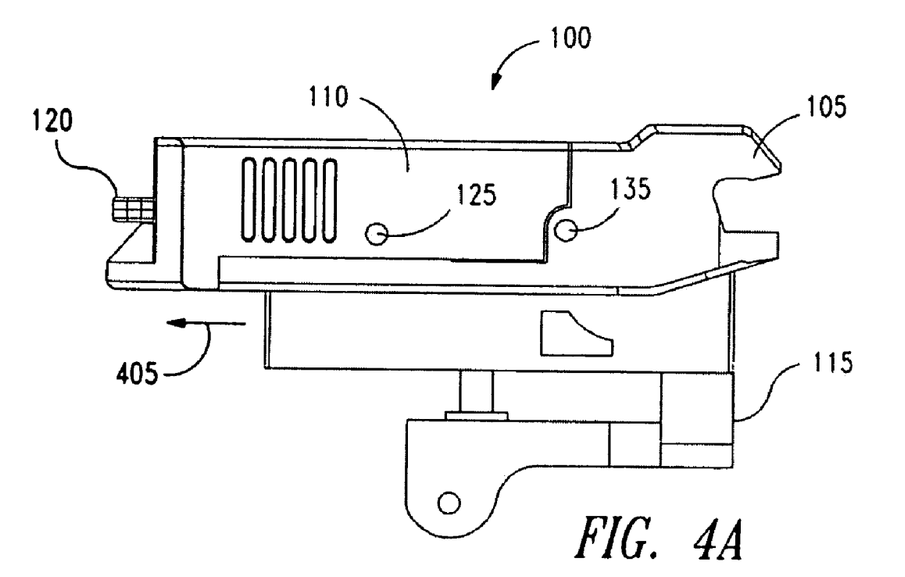
FIG. 4A is a block diagram of a side view of an ejector latch, in accordance with an embodiment of the invention.

FIG. 4A is a block diagram illustrating a side view of an ejector latch 100 in a closed and locked position. The movable handle portion 110 is pressed against the latch handle portion 105. When the handle release tab 120 is pressed, the movable handle portion 110 can unlock from the latch handle portion 105 and slide in the direction of arrow 405 away from the latch handle portion 105.

Figure 4B:
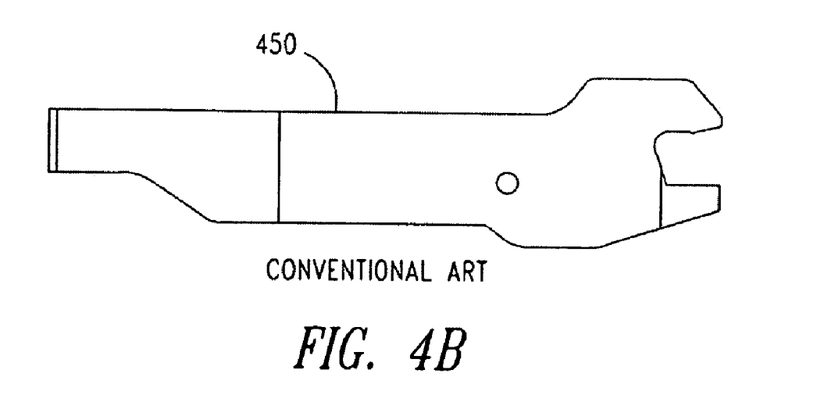
FIG. 4B is a block diagram of a side view of a conventional ejector latch.

FIG. 4B is a block diagram illustrating a side view of a conventional ejector latch 450. The conventional ejector latch 450 does not include any movable or extendable handle components. An example of a conventional latch is the a latch with the product number, 485-00013-00 MECH, SUB-ASSY, LATCH, FRONT PANEL, from CIENA CORPORATION, although the latch 450 may represent other types of conventional latches.

Figure 5A:
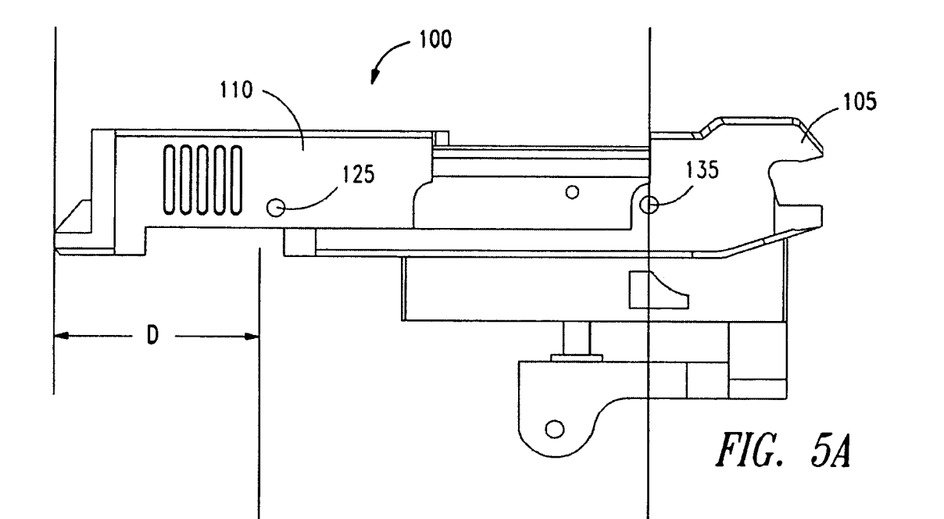
FIG. 5A is a block diagram of a side view of an ejector latch in the open (and unlocked) position, in accordance with an embodiment of the invention.
Figure 5B:
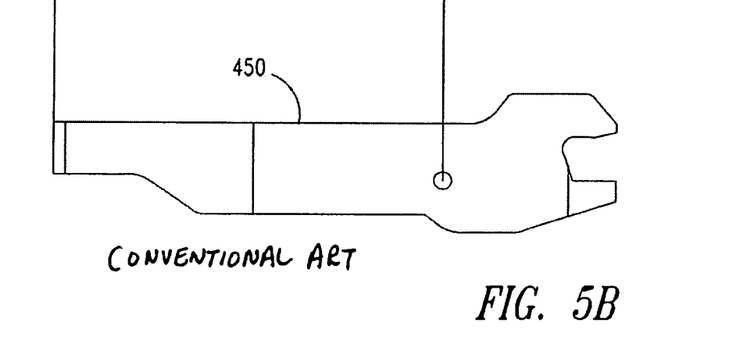
FIG. 5B is another block diagram of a side view of a conventional ejector latch, shown for the purpose of comparison with the ejector latch of FIG. 5A.

FIG. 5A is a block diagram illustrating a side view of an ejector latch 100 in an open and unlocked position. The movable handle portion 110 is extended away from the latch handle portion 105. As a result, in the open position the ejector latch 100 will be longer in length (for example, length "D" where D is a suitable length that can be varied) than the conventional latch 450 shown in FIG. 5B.

Since the ejector latch 100 can be extended by the length D, sufficient force or leverage can be provided by the user by grabbing the latch handle portion 110 to disengage the ejector latch from a portion or component of a carrier. In other words, the movable handle portion 110 provides an additional ability to pull out the ejector latch 100 from the portion or component of the carrier, since more force can now be applied to the ejector latch 100. For a connector (latch) that requires a high degree of force to disengage from a carrier, the conventional latch 450 is unable to adequately provide the function of easily pulling/disengaging the connector. It is noted that a smaller faceplate and smaller form factor circuit pack design means that the conventional ejector latches do not have sufficient leverage to eject the circuit pack. Making the handle of the conventional ejector latch at a longer fixed length to provide more pulling leverage for the user is not an attractive option because the longer fixed length handle would consume valuable face plate real estate that is needed for other purposes such as for connectors, indicators, ESD prevention devices, and/or other purposes.

In contrast, the movable handle portion 110 feature of the ejector latch 100 saves face plate real estate or surface area.

A handle portion 110 that can extend, for example, one inch, saves approximately two inches in face plate room, when the movable handle portion 110 is locked against the latch handle portion 105 in the closed position. Specifically, in this example, one (1) inch in height and one (1) inch in length are saved in face plate space when the movable handle portion 110 is locked against the latch handle portion 105. In other words, a square inch of valuable faceplate real estate is conserved by embodiments of the invention and such real estate can now be used for other purposes as described herein.

Figure 6:
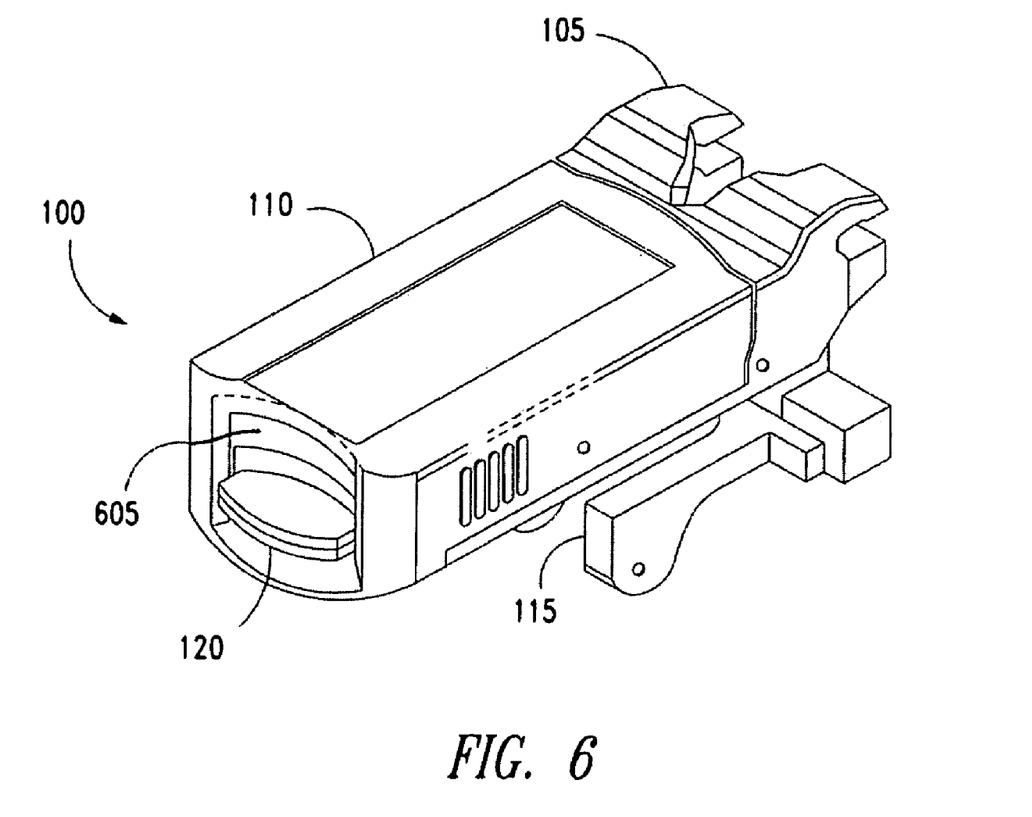
FIG. 6 is a block diagram of a perspective view of an ejector latch in the closed position, in accordance with an embodiment of the invention.

In FIG. 6, in one embodiment of the ejector latch 100, the handle release tab 120 is seen through a hole 605 of the movable handle portion 110 and is pressed in order to release (slide out and unlock) the movable handle portion 110 away from the latch handle portion 105. The tab 120 is shifted downward by the user and the spring 145 (FIG. 1) disengages the movable handle portion 110 and the movable handle portion 110 can then slide out. To close the movable handle portion 110 towards the latch handle portion 105, the tab 120 is pressed down and the movable handle portion 110 can then slide towards the latch handle portion 105 and lock in place as shown in FIG. 6.

Figure 7:
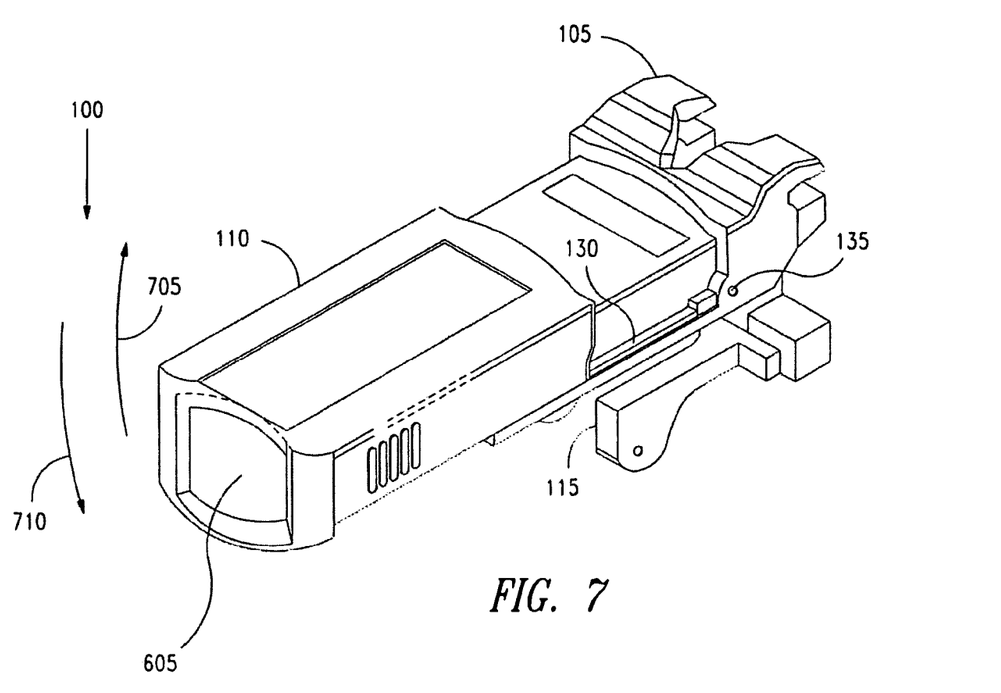
FIG. 7 is a block diagram of a perspective view of an ejector latch in the open position, in accordance with an embodiment of the invention.

FIG. 7 is another block diagram illustrating a side view of an ejector latch 100 in an open and unlocked position, in one embodiment of the invention. The movable handle portion 110 is extended away the latch handle portion 105 in order to unlock the ejector latch 100. When the ejector latch 100 is unlocked, the user can grab the movable handle portion 110 and rotate the latch handle portion 105 and the movable handle portion 110 in the direction of arrow 705. The latch handle portion 105 can pivot away from the latch base 115 at pivot pin 135, also in the direction of arrow 705. The user can also grab the movable handle portion 110 and rotate the latch handle portion 105 and the movable handle portion 110 in the direction of arrow 710 to pivot the portions 105 and 110 toward the latch base 115. These pivot actions are illustrated in additional detail in FIGS. 9 and 10 below.

Figure 10:
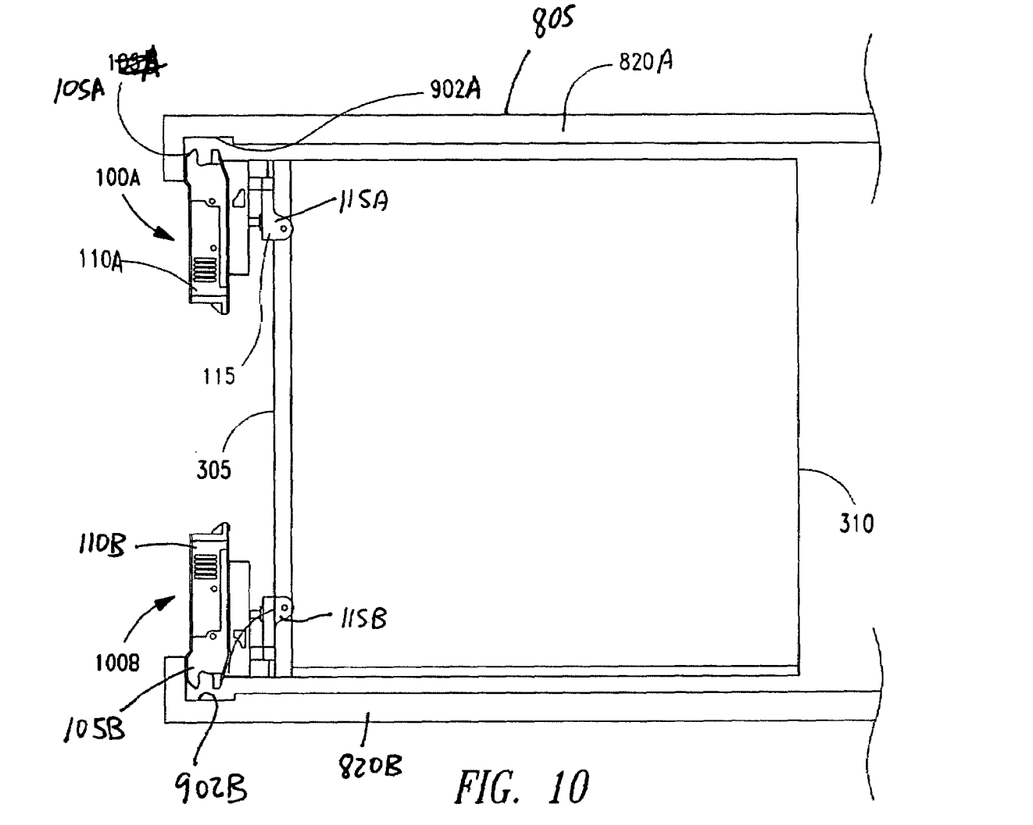
FIG. 10 is a block diagram showing an embodiment of the ejector latch in a closed position, where the ejector latch is engaged in a groove in a carrier surface.

FIG. 8 is a block diagram illustrating an embodiment of an ejector latches 100A and 100B that are attached to a faceplate 305 of a circuit pack 310, where the circuit pack 310 is insertable into and removable from a carrier 805. In FIG. 8, the ejector latches 100A and 100B are in the locked position, where the latch handles 105A and 105B and the movable handles 110A and 110B can not pivot away from the latch base 115 which is attached to the faceplate 305. The ejector latches 100A and 100B are placed by the user in this locked position after the circuit pack 310 is inserted in a track 801 of the carrier 805. Refer to FIG. 10 for a more detailed illustration of the ejector latches 100A and 100B in the locked position while disposed in a carrier 805.

The circuit pack 310 can be inserted into one of the tracks 801 of the carrier 805 by sliding the circuit pack 310, generally in the direction of arrow 815. After the circuit pack 310 are inserted into the track 801, the ejector latches 100A and 100B are placed into the locked position. The circuit pack 310 can be removed from one of the tracks 801 of the carrier 805 by sliding the circuit pack 310, generally in the direction of arrow 810. Prior to removing the circuit pack 310 from the track 801, the ejector latches 100A and 100B are placed into the unlocked position.

Figure 9:
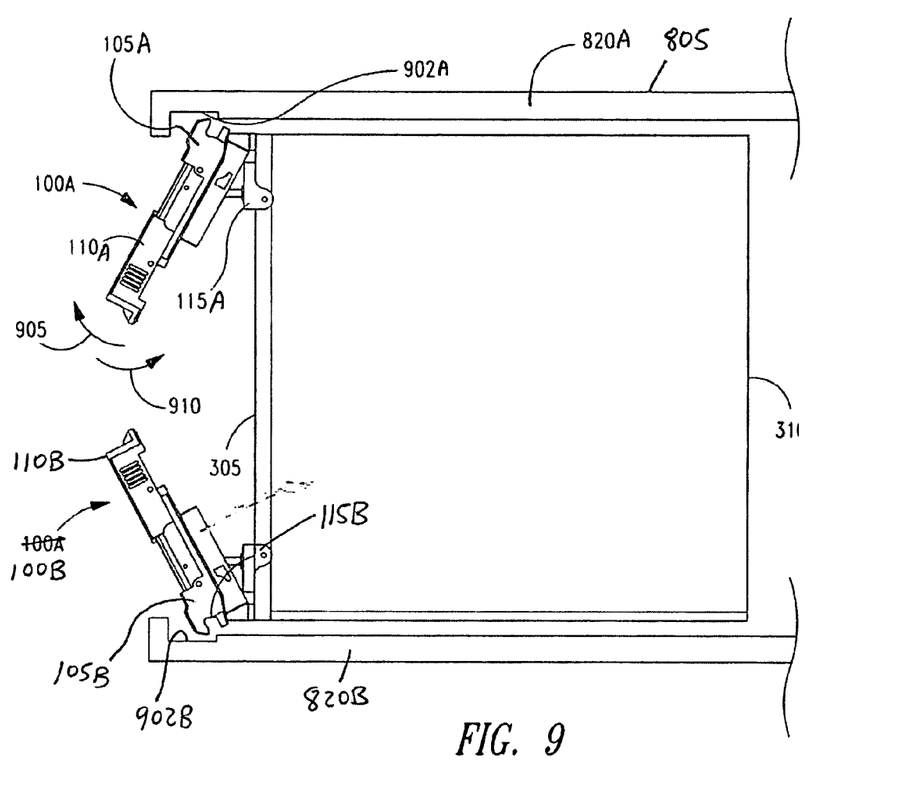
FIG. 9 is a block diagram showing an embodiment of the ejector latch in an open position, where the ejector latch is disengaged from a groove in a carrier surface.

As shown in FIGS. 9 and 10, the circuit pack 310 can be engaged and disengaged from the carrier 805 based upon the position of the ejector latches 100A and 100B against the portions 820A and 820B, respectively, of the carrier 805.

FIG. 9 is a block diagram showing an embodiment of the ejector latches 100A and 100B in an open and unlocked position, where the ejector latches 100A and 100B are disengaged from grooves 902A and 902B, respectively, in carrier portions 820A and 820B of carrier 805. The ejector latches 100A and 100B may be engaged and disengaged to other types of openings in the carrier portions 820A and 820B, and as a result, the grooves 902A and 902B may be replaced by other types of openings for receiving the latch handle portions 105A and 105B.

To disengage the circuit pack 310 from the carrier 805, the movable handle portion 110A of ejector latch 100A is extended away from the latch handle portion 105A to unlock the ejector latch 100A. The movable handle portion 110A and latch handle portion 105A can be rotated in the direction 905 so that the latch handle portion 105A is disengaged from the groove 902A.

Similarly, the movable handle portion 110B of ejector latch 100B is extended away from the latch handle portion 105B to unlock the ejector latch 100B. The movable handle portion 110B and latch handle portion 105B are then rotated so that the latch handle portion 105B is disengaged from the groove 902B.

As a result, the circuit pack 310 can be disengaged from the carrier 805 since the ejector latches 100A and 100B have been disengaged from the portions 820A and 820B, respectively, of the carrier 805.

FIG. 10 is a block diagram showing an embodiment of the ejector latches 100A and 100B in a closed position, where the ejector latches 100A and 100B are engaged in the grooves 902A and 902B, respectively, in the carrier portion 820. The movable handle portions 110A and latch handle portion 105A of ejector latch 100A can be rotated in the direction 910 (FIG. 9) so that the latch handle portion 105A is engaged within the groove 902A. To engage the circuit pack 310 to the carrier 805, the movable handle portion 110A is then pushed against the latch handle portion 105A to lock the ejector latch 100A.

Similarly, the movable handle portions 110B and latch handle portion 105B of ejector latch 100B can be rotated so that the latch handle portion 105B is engaged within the groove 902B. The movable handle portion 110B is then pushed against the latch handle portion 105B of ejector latch 100B to lock the ejector latch 100B.

As a result, the circuit pack 310 can be securely engaged to the carrier 805 since the ejector latches 100A and 100B have been locked into the grooves 902A and 902B, respectively, in the portions 820A and 820B of the carrier 805.

Figure 11:
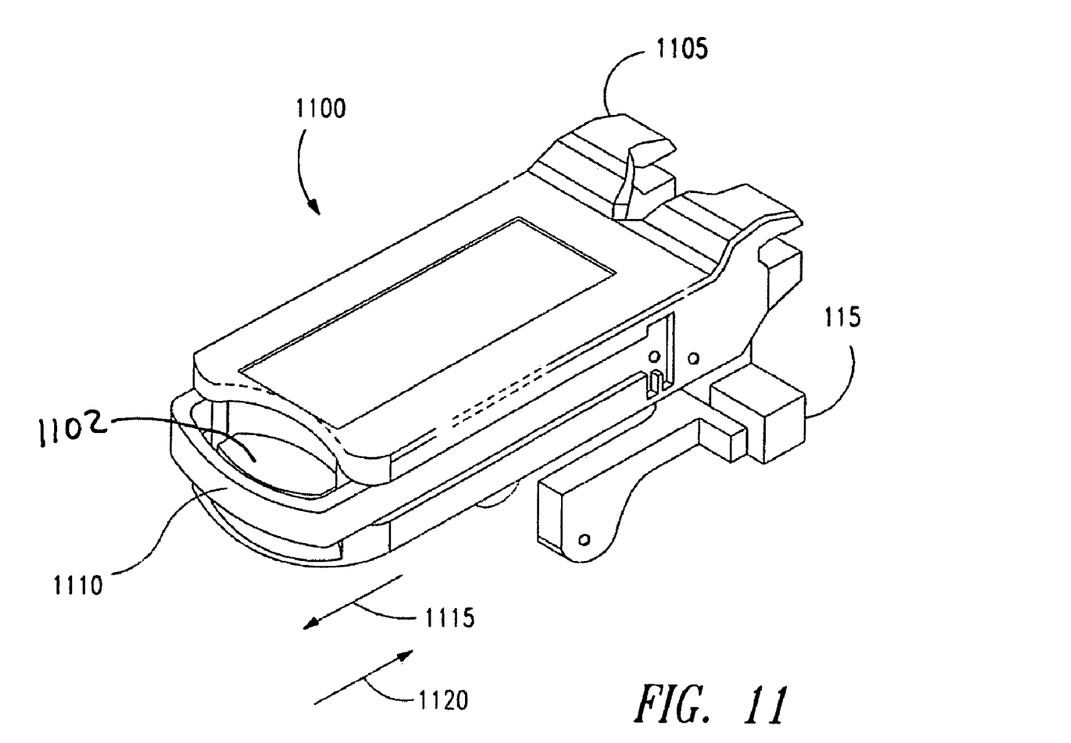
FIG. 11 is a block diagram of a perspective view of an ejector latch in the closed position, in accordance with another embodiment of the invention.

FIG. 11 is a block diagram illustrating an ejector latch 1100 in a closed and locked position, in accordance with another embodiment of the invention. The latch handle portion and the movable handle portion of an ejector latch may vary in shape and/or configuration. For example, the latch handle portion 1105 forms a substantial portion of the ejector latch 1100, while the movable handle portion 1110 is reduced in surface size and can extend away (as shown by arrow 1115) from the latch handle portion 1105 or can be closed against the latch handle portion 1105 (as shown by arrow 1120) to lock the movable handle portion 1110 against the latch handle portion 1105. Other shapes for the latch handle portion 1105 and/or movable handle portion 1110 and/or base 115 may be provided.

Figure 12:
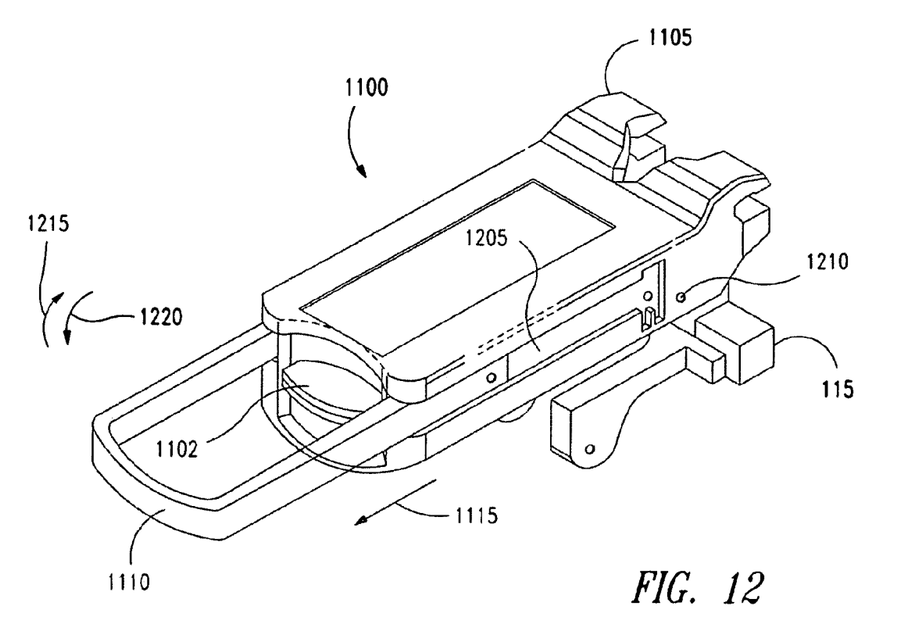
FIG. 12 is a block diagram of a perspective view of the ejector latch of FIG. 11 in the open position, in accordance with another embodiment of the invention.

FIG. 12 is a block diagram of a perspective view of the ejector latch 1100 of FIG. 11 in the open and unlocked position, in accordance with another embodiment of the invention. When the handle release tab 1102 is pressed by the user, the movable handle portion 1110 is unlocked from the latch handle portion 1105 and can slide in the direction of arrow 1115 away from the latch handle portion 1105. For example, the movable handle portion 1110 can slide along a track 1205 in the ejector latch 1100.

When the movable handle portion 1110 is extended away from the latch handle portion 1105, the ejector latch 1100 is unlocked. When the ejector latch 1100 is unlocked, the user can grab the movable handle portion 1110 and rotate the latch handle portion 1105 and the movable handle portion 1110 in the direction of arrow 1215. The latch handle portion 1105 can pivot away from the latch base 115 at pivot pin 1210 in the direction of arrow 1215. The user can also grab the movable handle portion 1110 and rotate the latch handle portion 1105 and the movable handle portion 1110 in the direction of arrow 1220 to pivot the portions 1105 and 1110 toward the latch base 115. These pivot actions were similarly described above.

Figure 13:
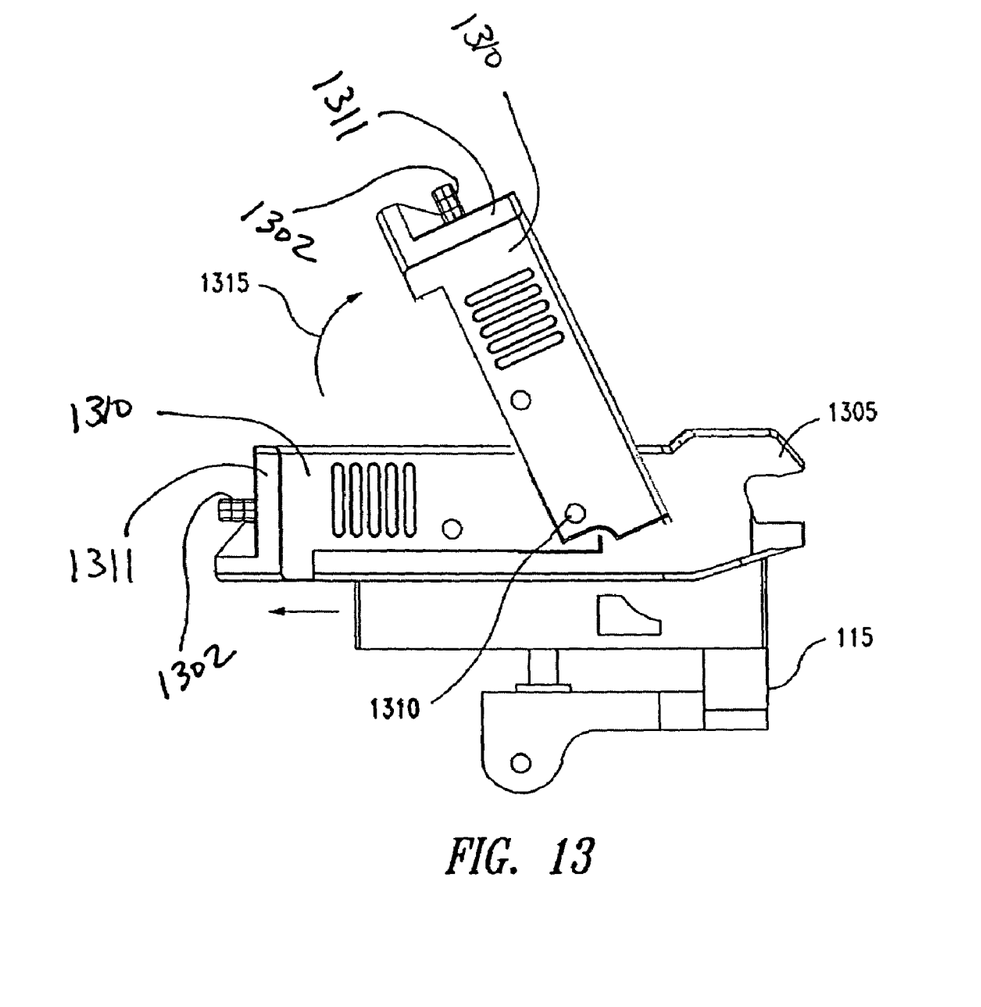
FIG. 13 is a block diagram of a side view of an ejector latch in accordance with another embodiment of the invention, where the movable handle is configured to rotate or pivot with respect to the latch handle portion.

FIG. 13 is a block diagram of a side view of an ejector latch 1300 in accordance with another embodiment of the invention, where the movable handle portion 1310 is configured to rotate or flip away from the latch handle portion 1305, in the direction of arrow 1315. Therefore, when the user presses the tab 1302, the user can unlock and disengage the movable handle portion 1310 from the latch handle portion 1305. The user can then rotate the movable handle portion 1310 (including end portion 1311) in the direction of arrow 1315. The latch handle portion 1305 can then pivot away from the latch base 115 at pivot pin 1310 in the direction of arrow 1315, and the latch handle portion 1305 can disengage from, for example, a portion of a carrier 805 as similarly described above.

The movable handle portion (e.g., movable handle portions 110, 810, or 1310) can be formed from plastic or metal. Of course a variety of other materials could be used as long as they have the necessary material properties such as sufficient structural rigidity, machinability (or moldability), or the like. For example, the movable handle portion 110 can be formed from carbon fiber composite for strength and electrical conductivity.

Reference throughout this specification to "one embodiment", "an embodiment", or "a specific embodiment" means that a particular feature, structure, or characteristic described in connection with the embodiment is included in at least one embodiment of the present invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing teaching.

It will also be appreciated that one or more of the elements depicted in the drawings/figures can also be implemented in a more separated or integrated manner, or even removed or rendered as inoperable in certain cases, as is useful in accordance with a particular application.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

The description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An ejector latch, comprising:
   a latch base;
   a latch handle portion operatively coupled to the latch base;
   a spring-loaded movable handle portion movingly coupled to the latch handle portion, said spring-loaded movable handle portion being movable with respect to said latch handle portion so as to extend an effective length of said latch handle portion, wherein the movable handle portion is rotatable coupled to the latch handle portion, thereby enabling rotation of the spring-loaded movable handle portion with respect to the latch handle portion; and
   a handle release tab which, when actuated, causes a spring to move said spring-loaded movable handle portion with respect to said latch handle portion so as to extend the effective length of said latch handle portion.

2. The ejector latch of claim 1, wherein the spring-loaded movable handle portion is configured to close against the latch handle portion.

3. The ejector latch of claim 1, wherein the spring-loaded movable handle portion is configured to extend away from the latch handle portion in order to pivot the latch handle portion with respect to latch base.

4. The ejector latch of claim 1, wherein the spring-loaded movable handle portion is movingly coupled to the latch handle portion by sliding toward and away from the latch handle portion.

5. The ejector latch of claim 1, wherein the spring-loaded movable handle portion is formed from metal.

6. The ejector latch of claim 1, wherein the spring-loaded movable handle portion is formed from plastic.

7. The ejector latch of claim 1, wherein the spring-loaded movable handle portion is formed from carbon fiber composite.

8. The ejector latch of claim 1, wherein the latch base is attachable to a face plate.

9. The ejector latch of claim 8, wherein the face plate is attached to a circuit pack.

10. The ejector latch of claim 9, wherein the circuit pack is securely attached to a carrier by the ejector latch.

11. A method of assembling an ejector latch, the method comprising:
    providing a latch handle portion; attaching a spring-loaded movable handle portion to the latch handle portion, wherein the movable handle portion is movingly coupled to the latch handle portion, said spring-loaded movable handle portion being movable with respect to said latch handle portion so as to extend an effective length of said latch handle portion, and wherein the spring-loaded movable handle portion is rotatable coupled to the latch handle portion, thereby enabling rotation of the movable handle portion with respect to the latch handle portion;

providing a handle release tab which, when actuated, causes a spring to move said spring-loaded movable handle portion with respect to said latch handle portion so as to extend the effective length of said latch handle portion; and attaching the latch base to a face plate.

12. The method of claim 11, further comprising:

attaching the latch base to a face plate.

13. The method of claim 12, wherein the face plate is attached to a circuit pack.

14. The method of claim 13, further comprising:

securely attaching the circuit pack to a carrier by the ejector latch.

\* \* \* \* \*